United States Patent
Jin et al.

(10) Patent No.: US 9,083,378 B2
(45) Date of Patent: Jul. 14, 2015

(54) DYNAMIC COMPRESSION/DECOMPRESSION (CODEC) CONFIGURATION

(71) Applicants: Zhonghui Jin, Shanghai (CN); Nan Qiao, Beijing (CN)

(72) Inventors: Zhonghui Jin, Shanghai (CN); Nan Qiao, Beijing (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/128,004

(22) PCT Filed: Jun. 24, 2013

(86) PCT No.: PCT/CN2013/077739
§ 371 (c)(1),
(2) Date: Dec. 20, 2013

(87) PCT Pub. No.: WO2014/205619
PCT Pub. Date: Dec. 31, 2014

(65) Prior Publication Data
US 2014/0375484 A1     Dec. 25, 2014

(51) Int. Cl.
*H03M 1/48*     (2006.01)
*H03M 7/30*     (2006.01)
*H03M 1/00*     (2006.01)

(52) U.S. Cl.
CPC ............ *H03M 7/6047* (2013.01); *H03M 1/001* (2013.01); *H03M 1/002* (2013.01); *H03M 7/6058* (2013.01)

(58) Field of Classification Search
CPC . H03M 7/6047; H03M 7/6058; H03M 1/001; H03M 1/002
USPC ........... 341/110, 144, 155; 370/241, 252, 247
See application file for complete search history.

(56) References Cited

U.S. PATENT DOCUMENTS

| 5,432,513 | A  | * | 7/1995  | Okamoto ...................... 341/108 |
| 6,754,232 | B1 | * | 6/2004  | Tasker ........................... 370/477 |
| 7,023,839 | B1 | * | 4/2006  | Shaffer et al. .................. 370/356 |
| 7,639,744 | B1 | * | 12/2009 | Kogler ........................... 375/243 |
| 2010/0161340 | A1 | * | 6/2010 | Walsh et al. .................... 704/500 |

FOREIGN PATENT DOCUMENTS

| CN | 1487474 A    | 4/2004 |
| CN | 1784906 A    | 6/2006 |
| EP | 0 734 173 A2 | 9/1996 |
| WO | 03/039171 A1 | 5/2003 |

OTHER PUBLICATIONS

International Search Report and Written Opinion received for PCT Patent Application No. PCT/CN2013/077739, mailed on Apr. 3, 2014, 10 pages.

* cited by examiner

*Primary Examiner* — Brian Young
(74) *Attorney, Agent, or Firm* — Grossman, Tucker, Perreault & Pfleger, PLLC (57) ABSTRACT

The present disclosure is directed dynamic compression/decompression (codec) configuration. In general, a device may include a codec configuration module to determine a configuration for use by the codec based on configuration criteria. The configuration criteria may include, for example, data characteristic information, system condition information and user expectation information. The configuration information may be used to select a codec configuration from one or more available codec configurations. For example, a benchmark module also in the device may determine the available codec configurations. After a codec configuration has been selected, it may be set in the codec. It may also be possible for the codec configuration module to monitor for changes in device operation (e.g., changes in the configuration criteria) and to update the codec configuration based on the monitored changes.

20 Claims, 3 Drawing Sheets

DYNAMIC COMPRESSION/DECOMPRESSION (CODEC) CONFIGURATION

TECHNICAL FIELD

The present disclosure relates to device data processing, and more particularly, to configuring data compression/decompression in a device based on configuration criteria.

BACKGROUND

Data compression/decompression is utilized often in modern computing to facilitate expedited data communication. For example, the transmission of multimedia content (e.g., textual information, audio information, image information and/or video information) would take substantially longer without the use of data compression. Further to the inconvenience involved in waiting for information and quality issues involved when communicating using uncompressed data, wireless-enabled devices (e.g., cellular handsets, smart phones, tablet computers, etc.) may rely upon data compression help overcome communication and power issues. For example, the limited data transmission speed and capacity of existing wireless communication mediums, combined with limited battery life, makes compression a necessity.

Hardware and/or software configured to perform data compression/decompression in a device (e.g., codecs) consume resources as needed (e.g., processing, memory, power, etc.) during data processing. In particular, in performing data compression/decompression codecs operate using whatever system resources they need without any regard to device conditions. For example, a codec that operates in parallel mode data compression may be preconfigured to always launch eight threads in a processor of the device regardless of the actual amount of data to compress/decompress, the number of processing cores that are idle/busy, the amount of available memory, the amount of power remaining, etc. Operating without any regard for the amount of data to be processed, the condition of the device, etc. may negatively impact other operations also occurring in the device, reducing the quality of experience for the user.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Although the following Detailed Description will proceed with reference being made to illustrative embodiments, many alternatives, modifications and variations thereof will be apparent to those skilled in the art.

DETAILED DESCRIPTION

The present disclosure is directed dynamic compression/decompression (codec) configuration. In general, a device may include a codec configuration module to determine a configuration for use by the codec based on configuration criteria. The configuration criteria may include, for example, data characteristic information, system condition information and user expectation information. The configuration information may be used to select a codec configuration from one or more available codec configurations. For example, a benchmark module also in the device may determine the available codec configurations. After a codec configuration has been selected, it may be set in the codec. It may also be possible for the codec configuration module to monitor for changes in device operation (e.g., changes in the configuration criteria) and to update the codec configuration based on the monitored changes.

In one embodiment, a device may comprise, for example, at least a codec module, a benchmark module and a codec configuration module. The codec module may be to perform data compression/decompression. The benchmark module may be to determine at least one codec configuration. The codec configuration module may be to determine configuration criteria, to select a codec configuration determined by the benchmark module based on the configuration criteria and to set the selected codec configuration in the codec module.

In performing benchmarking, the benchmark module may be to determine different codec configurations corresponding to different combinations of configuration criteria. The codec configuration module may then be to select one of the different codec configurations based on determining the combination of configuration criteria. In one embodiment, the configuration criteria may comprise at least one of data characteristic information, system condition information or user expectation information. Data characteristic information may comprise, for example, at least one of data size or data type. System condition information may comprise, for example, at least one of resource usage in the device over a prior time period or available resources in the device. Example resources in the device may comprise at least one of processing resources, memory resources or power resources. User expectation information may comprise, for example, at least one of high compression/decompression speed or high compression/decompression ratio.

The at least one codec configuration may comprise, for example, at least one of a number of processing threads, data block size, dictionary size or compression level. In one embodiment, after setting the selected codec configuration the codec configuration module may further be to determine if the configuration criteria have changed, and if the configuration criteria is determined to have changed, to select a new codec configuration determined by the benchmark module based on the changed configuration criteria and to set the new codec configuration in the codec module. An example method consistent with at least one embodiment of the present disclosure may include determining configuration criteria in a device, selecting a codec configuration for configuring a codec module in the device from at least one codec configuration determined by a benchmark module in the device, the selecting of the codec configuration being based on the configuration criteria and setting the selected codec configuration in the codec module.

Figure 1:
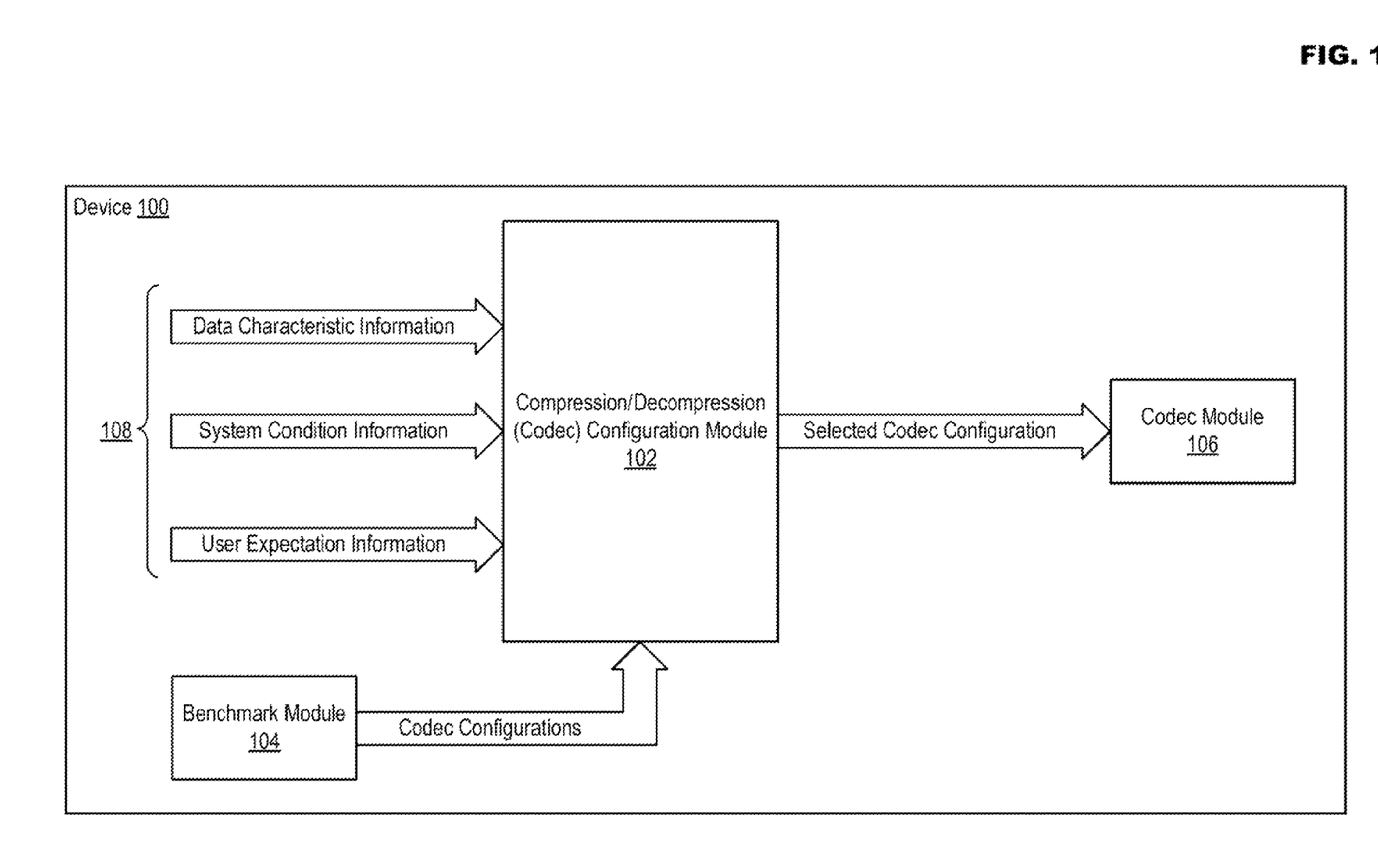
FIG. 1 illustrates an example of dynamic compression/decompression (codec) configuration in accordance with at least one embodiment of the present disclosure.

FIG. 1 illustrates an example of dynamic compression/decompression (codec) configuration in accordance with at least one embodiment of the present disclosure. Device 100 may provide an example platform through which embodiments of the present disclosure may be explained. Examples of device 100 may include, but are not limited to, a mobile communication device such as a cellular handset or a smartphone based on the Android® operating system (OS), iOS®, Windows® OS, Blackberry® OS, Palm® OS, Symbian® OS, etc., a mobile computing device such as a tablet computer like an iPad®, Surface®, Galaxy Tab®, Kindle Fire®, etc., an Ultrabook® including a low-power chipset manufactured by Intel Corporation, a netbook, a notebook, a laptop, a palmtop, etc., a stationary computing device such as a desktop computer, a set-top device, a smart television (TV), etc.

In one embodiment, device 100 may comprise at least compressor/decompressor (codec) configuration module 102, benchmark module 103 and codec module 106. Codec configuration module 102 may be to determine configuration criteria 108 and to select a codec configuration based on configuration criteria 108. Configuration criteria 108 may include, for example, data characteristic information, system configuration information and user expectation information. Data characteristic information may describe the data to be processed by codec module 106 and may include, for example, input data size (e.g., 1 KB, 1 MB, etc.) and type (e.g., plain text, binary file, etc.). Data characteristic information may be included as part of the input data or may be determined in codec configuration module 102 by analyzing the input data. System condition information may pertain to the state of device 100 including recent (e.g., within a prior time period) loading and available resource information. For example, system condition information may include recent processing and disk load information (e.g., a number of active processes, percent utilizations, etc.), available power, a number of available CPU cores, an amount of available temporary/persistent memory, etc. System condition information may be generally available in device 100 or may be determined (e.g., on demand) by codec configuration module 102. User expectation information may describe a level of data compression performance specified by user configuration of device 100. For example, device 100 may be configured to specify higher speed compression using a lower compression ratio, which may result in fast processing but more data to transmit, or higher compression ratio resulting in better data compression but at a substantially slower speed. Higher speed compression may be desirable when device 100 has limited available resources but is connected to a data communication path with high bandwidth (e.g., a wired broadband connection), while higher ratio compression may be more desirable when device 100 has ample resources but is connected to a lower bandwidth connection (e.g., 3G cellular data). The combination of these different categories of information in configuration criteria 108 may describe a scenario that may correspond to at least one codec configuration. Based on configuration criteria 108, codec configuration module 102 may then proceed to select a codec configuration and may then set the selected codec configuration in codec module 106.

In one embodiment, benchmark module 104 may be to determine codec parameters yielding better performance in certain situations, and to then formulate codec configurations based on the determination. For example, benchmark module 104 may execute benchmark testing when installed in device 100 or whenever the configuration of device 100 changes (e.g., whenever new hardware, software, drivers, etc. are installed). Benchmark module may perform testing to determine settings for parameters in at least one codec configuration. In one embodiment, a plurality of codec configurations may be determined based on different situations that may be specified by the selection criteria. Example parameters that may be included in a codec configuration may include, but are not limited to, a number of processing threads for processing the input data, a data block size (e.g., 64 MB, 512 MB, 1 GB, etc.), a dictionary size (e.g., for replacing actual data with abbreviations, the higher the dictionary size the better the compression), compression level (e.g., fast, normal, maximum, etc.), etc. For example, if there is not a lot of data to process the selected codec configuration may set codec module 106 to launch fewer process threads and use a smaller data block size to free up resources in device 100 for other tasks. If there is a lot of data to process, or if a high ratio of compression is desired, the selected codec configuration may cause codec module 106 to launch more process threads, use a larger data block size, use a larger sized dictionary, etc.

Figure 2:
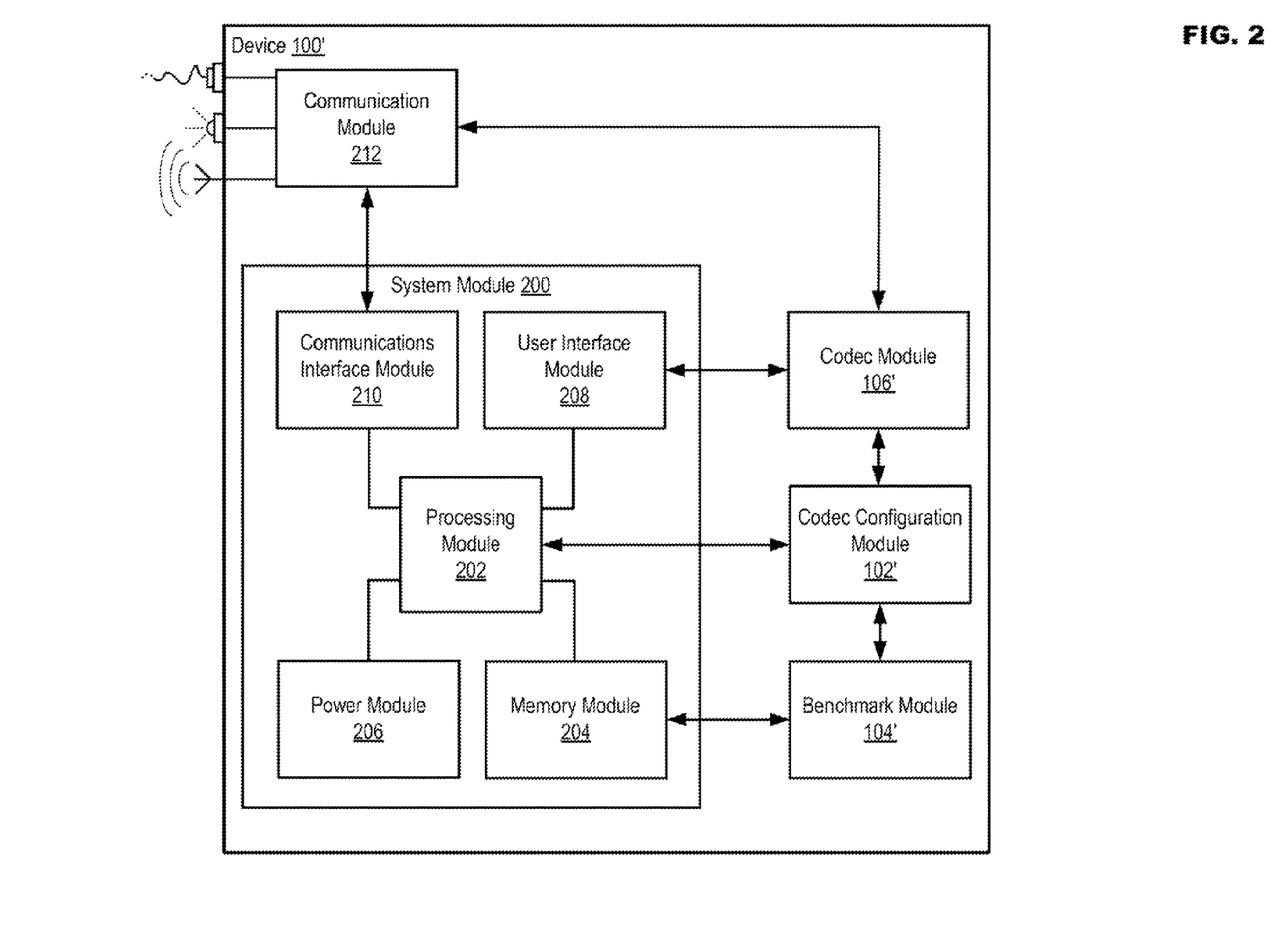
FIG. 2 illustrates an example configuration for a device usable in accordance with at least one embodiment of the present disclosure.

FIG. 2 illustrates an example configuration for a device usable in accordance with at least one embodiment of the present disclosure. Device 100' may support functionality such as described in regard to any of the devices disclosed in FIG. 1. However, it is important to note that device 100' is only an example of equipment that may be used in accordance with embodiments consistent with the present disclosure, and is not meant to limit these various embodiments to any particular manner of implementation.

Device 100' may comprise system module 200 configured to manage device operations. System module 200 may include, for example, processing module 202, memory module 204, power module 206, user interface module 208 and communication interface module 210 configured to interact with communication module 212. Device 100' may also include codec configuration module 102', benchmark module 104' and codec module 106'. While communication module 212, codec configuration module 102', benchmark module 104' and codec module 106' have been shown separately from system module 200 in FIG. 2, this example implementation of device 100' is merely for the sake of explanation. Some or all of the functionality associated with communication module 212, codec configuration module 102', benchmark module 104' and codec module 106' may also be incorporated within system module 200.

In device 100', processing module 202 may comprise one or more processors situated in separate components, or alternatively, may comprise one or more processing cores embodied in a single component (e.g., in a System-on-a-Chip (SoC) configuration) and any processor-related support circuitry (e.g., bridging interfaces, etc.). Example processors may include, but are not limited to, various x86-based microprocessors available from the Intel Corporation including those in the Pentium, Xeon, Itanium, Celeron, Atom, Core i-series product families, Advanced RISC (e.g., Reduced Instruction Set Computing) Machine or "ARM" processors, etc. Examples of support circuitry may include chipsets (e.g., Northbridge, Southbridge, etc. available from the Intel Corporation) configured to provide an interface through which processing module 202 may interact with other system components that may be operating at different speeds, on different buses, etc. in device 100'. Some or all of the functionality commonly associated with the support circuitry may also be included in the same physical package as the processor (e.g., such as the Sandy Bridge integrated circuit available from the Intel Corporation).

Processing module 202 may be configured to execute various instructions in device 100'. Instructions may include program code configured to cause processing module 202 to perform activities related to reading data, writing data, processing data, formulating data, converting data, transforming data, compressing/decompressing data, etc. Information (e.g., instructions, data, etc.) may be stored in memory module 204. Memory module 204 may comprise random access memory (RAM) or read-only memory (ROM) in a fixed or removable format. RAM may include memory configured to hold information during the operation of device 100' such as, for example, static RAM (SRAM) or Dynamic RAM (DRAM). ROM may include memories such as bios or Unified Extensible Firmware Interface (UEFI) memory configured to provide instructions when device 100' activates, programmable memories such as electronic programmable ROMs (EPROMS), Flash, etc. Other fixed and/or removable memory may include magnetic memories such as, for example, floppy disks, hard drives, etc., electronic memories such as solid state flash memory (e.g., embedded multimedia card (eMMC), etc.), removable memory cards or sticks (e.g., micro storage device (uSD), USB, etc.), optical memories such as compact disc-based ROM (CD-ROM), etc. Power module 206 may include internal power sources (e.g., a battery) and/or external power sources (e.g., electromechanical or solar generator, power grid, fuel cell, etc.), and related circuitry configured to supply device 100' with the power needed to operate.

User interface module 208 may include equipment and software configured to allow users to interact with device 100' such as, for example, various input mechanisms (e.g., microphones, switches, buttons, knobs, keyboards, speakers, touch-sensitive surfaces, one or more sensors configured to capture images and/or sense proximity, distance, motion, gestures, orientation, etc.) and output mechanisms (e.g., speakers, displays, lighted/flashing indicators, electromechanical components for vibration, motion, etc.). Communication interface module 210 may be configured to handle packet routing and other control functions for communication module 212, which may include resources configured to support wired and/or wireless communications. Wired communications may include serial and parallel wired mediums such as, for example, Ethernet, Universal Serial Bus (USB), Firewire, Digital Video Interface (DVI), High-Definition Multimedia Interface (HDMI), etc. Wireless communications may include, for example, close-proximity wireless mediums (e.g., radio frequency (RF) such as based on the Near Field Communications (NFC) standard, infrared (IR), optical character recognition (OCR), magnetic character sensing, etc.), short-range wireless mediums (e.g., Bluetooth, WLAN, Wi-Fi, etc.) and long range wireless mediums such as, for example, various cellular wide-area radio communication technologies, satellite-based communications, etc. In one embodiment, communication interface module 210 may be configured to prevent wireless communications that are active in communication module 212 from interfering with each other. In performing this function, communication interface module 210 may schedule activities for communication module 212 based on, for example, the relative priority of messages awaiting transmission.

In the embodiment illustrated in FIG. 2, codec configuration module 102', benchmark module 104' and codec module 106' are shown to interact with particular modules in device 100', however, these interactions are simply to explain example operation and are not meant to limit these modules to particular sort of interaction. Benchmark module 104' may interact with at least memory module 204, wherein it may store at least one codec configuration. For example, the at least one codec configuration may be determined through benchmark testing. Benchmark module 104' may proceed to make the at least one codec configuration available to codec configuration module 102'. Codec configuration module 102' may interact with at least processing module 202 by which it may obtain configuration criteria 108 for selecting at least one codec configuration. Codec configuration module 102' may then set the selected codec configuration in codec module 106'. In an example of operation, codec module 106' may interact with user interface module 208 and communication module 212. For example, compressed data may be received via communication module 212 that may be decompressed by codec module 106' prior to presentation via user interface module 208. Conversely, data may be received from user interface module 208 for compression in codec module 106', and the compressed data may then be provided to communication module 221 for transmission.

Figure 3:
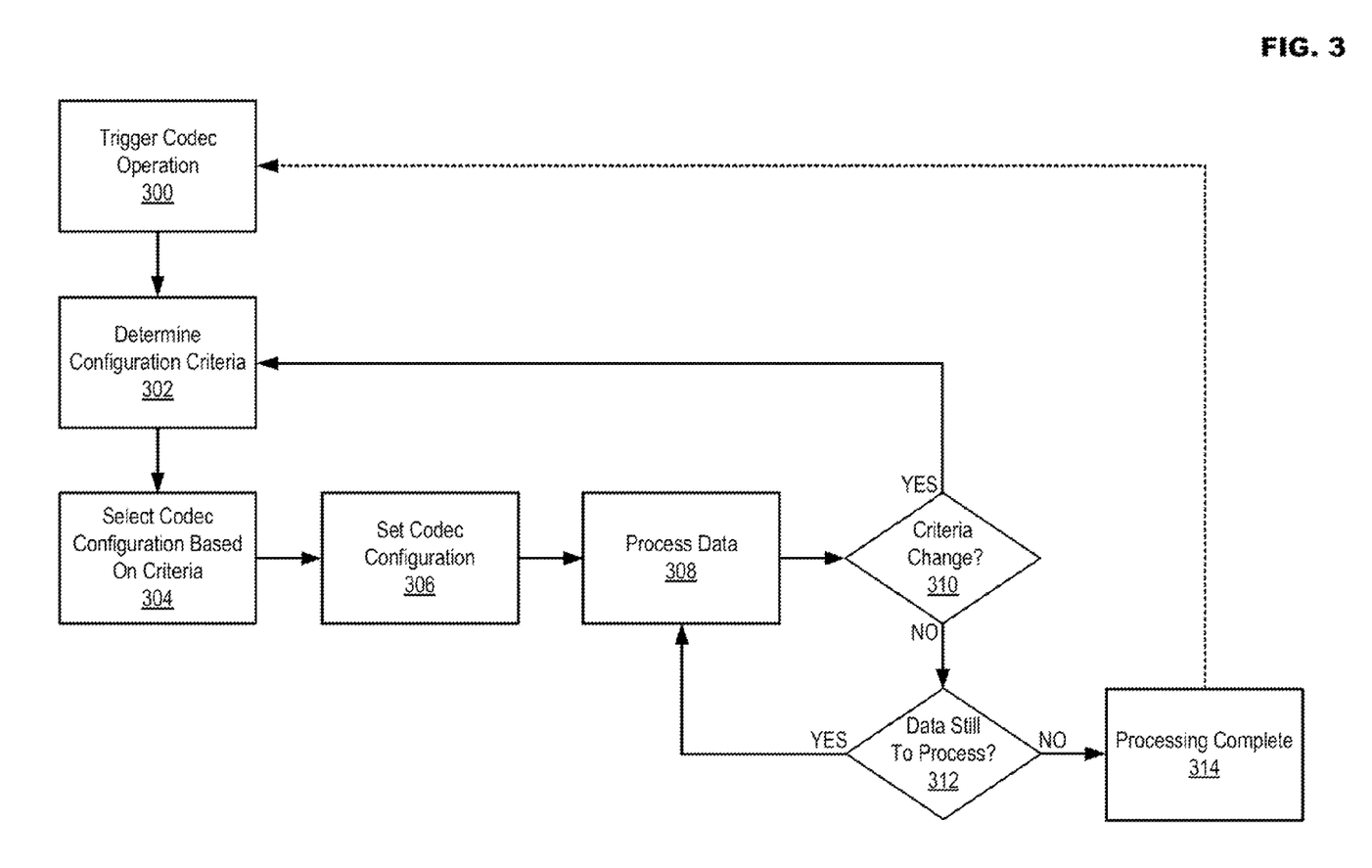
FIG. 3 illustrates example operations for dynamic compression/decompression (codec) configuration in accordance with at least one embodiment of the present disclosure.

FIG. 3 illustrates example operations for dynamic compression/decompression (codec) configuration in accordance with at least one embodiment of the present disclosure. In operation, 300 a codec operation (e.g., compression or decompression) may be triggered in a device. For example, codec operation may be triggered by compressed data being received in the device, an application being triggered on the device requiring data compression (e.g., prior to transmission to the other device), etc. Configuration criteria may then be determined in operation 302. For example, a codec configuration module in the device may query for the configuration criteria such as data characteristic information, system condition information and user expectation information. In operation 304 the configuration criteria may be utilized to select a codec configuration. For example, a benchmark module in the device may provide at least one codec configuration to the codec configuration module. In one embodiment, a plurality of codec configurations may be available for selection based on the configuration criteria. In operation 306, the selected codec configuration may be set in a codec module.

Any data pending for processing (e.g., compression or decompression) may then be processed by the codec in operation 308. In one embodiment, a further determination may be made in operation 310 as to whether any of the configuration criteria has changed since the codec configuration was set. For example, data characteristics may change during the course of receiving the data, the device may become busier with other processing tasks or have less memory available, the power level of the device may be lower (e.g., if running on localized power source like a battery), the desired performance settings for consuming/presenting the input data may have been changed by a device user, etc. If in operation 310 it is determined that any of the configuration have changed (e.g., in a significant manner), then operation 310 may be followed by a return to operation 302 to determine new configuration criteria and set a new codec configuration. If in operation 310 it is determined that the configuration criteria has not changed, then in operation 312 a further determination may be made as to whether the data has completed processing. Operation 312 may then be followed by a return to operation 308 if it is determined that there is still data to process. Otherwise, if in operation 312 it is determined that there is no remaining data to process, then in operation 314 processing may be complete. Optionally, operation 314 may be followed by a return to operation 300 in preparation for the next instance where codec operations are triggered in the device.

While FIG. 3 illustrates operations according to an embodiment, it is to be understood that not all of the operations depicted in FIG. 3 are necessary for other embodiments. Indeed, it is fully contemplated herein that in other embodiments of the present disclosure, the operations depicted in FIG. 3, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the term "module" may refer to software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The modules may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more storage mediums having stored thereon, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software modules executed by a programmable control device.

Thus, the present disclosure is directed dynamic compression/decompression (codec) configuration. In general, a device may include a codec configuration module to determine a configuration for use by the codec based on configuration criteria. The configuration criteria may include, for example, data characteristic information, system condition information and user expectation information. The configuration information may be used to select a codec configuration from one or more available codec configurations. For example, a benchmark module also in the device may determine the available codec configurations. After a codec configuration has been selected, it may be set in the codec. It may also be possible for the codec configuration module to monitor for changes in device operation (e.g., changes in the configuration criteria) and to update the codec configuration based on the monitored changes.

The following examples pertain to further embodiments. The following examples of the present disclosure may comprise subject material such as a device, a method, at least one machine-readable medium for storing instructions that when executed cause a machine to perform acts based on the method, means for performing acts based on the method and/or a system for dynamic compression/decompression (codec) configuration, as provided below.

EXAMPLE 1

According to this example there is provided a device. The device may include a codec module to perform data compression or data decompression, a benchmark module to determine at least one codec configuration and a codec configuration module to determine configuration criteria, select a codec configuration determined by the benchmark module based on the configuration criteria and set the selected codec configuration in the codec module.

EXAMPLE 2

This example includes the elements of example 1, wherein the benchmark module is to determine the at least one codec configuration by performing testing based on changes in device configuration.

EXAMPLE 3

This example includes the elements of any of examples 1 to 2, wherein the benchmark module is to determine different codec configurations corresponding to different combinations of configuration criteria.

EXAMPLE 4

This example includes the elements of example 3, wherein the codec configuration module is to select one of the different codec configurations based on determining the combination of configuration criteria.

EXAMPLE 5

This example includes the elements of any of examples 1 to 4, wherein the configuration criteria comprise at least one of data characteristic information, system condition information or user expectation information.

EXAMPLE 6

This example includes the elements of example 5, wherein the data characteristic information comprises at least one of data size or data type.

EXAMPLE 7

This example includes the elements of any of examples 5 to 6, wherein the codec configuration module is to determine the data characteristic information by analyzing data to be compressed or decompressed by the codec module.

EXAMPLE 8

This example includes the elements of any of examples 5 to 7, wherein the system condition information comprises at least one of resource usage in the device over a prior time period or available resources in the device.

EXAMPLE 9

This example includes the elements of example 8, wherein resources comprise at least one of processing resources, memory resources or power resources in the device.

EXAMPLE 10

This example includes the elements of any of examples 5 to 9, wherein the codec configuration module is to determine the system condition information by analyzing the device.

EXAMPLE 11

This example includes the elements of any of examples 5 to 10, wherein user expectation information comprises at least one of high compression/decompression speed or high compression/decompression ratio.

EXAMPLE 12

This example includes the elements of any of examples 1 to 11, wherein the at least one codec configuration comprises at least one of number of processing threads, data block size, dictionary size or compression level.

EXAMPLE 13

This example includes the elements of any of examples 1 to 12, wherein after setting the selected codec configuration the codec configuration module is further to determine if the configuration criteria has changed, and if the configuration criteria are determined to have changed, select a new codec configuration determined by the benchmark module based on the changed configuration criteria and set the new codec configuration in the codec module.

EXAMPLE 14

This example includes the elements of example 1, wherein the data characteristic information comprises at least one of data size or data type, the system condition information comprises at least one of resource usage in the device over a prior time period or available resources in the device, the resources comprising at least one of processing resources, memory resources or power resources in the device, and the user expectation information comprises at least one of high compression/decompression speed or high compression/decompression ratio.

EXAMPLE 15

This example includes the elements of any of examples 1 to 14, wherein the device is a mobile communication device.

EXAMPLE 16

This example includes the elements of any of examples 1 to 14, wherein the device is a mobile computing device.

EXAMPLE 17

This example includes the elements of any of examples 1 to 14, wherein the device is a stationary computing device.

EXAMPLE 18

According to this example there is provided a method. The method may include determining configuration criteria in a device, selecting a codec configuration for configuring a codec module in the device from at least one codec configuration determined by a benchmark module in the device, the selecting of the codec configuration being based on the configuration criteria and setting the selected codec configuration in the codec module.

EXAMPLE 19

This example includes the elements of example 18, wherein the configuration criteria comprises at least one of data characteristic information, system condition information or user expectation information.

EXAMPLE 20

This example includes the elements of example 19, wherein the data characteristic information comprises at least one of data size or data type.

EXAMPLE 21

This example includes the elements of any of examples 19 to 20, wherein determining configuration criteria comprises analyzing data to be compressed or decompressed by the codec module to determine data characteristic information.

EXAMPLE 22

This example includes the elements of any of examples 19 to 21, wherein the system condition information comprises at least one of resource usage in the device over a prior time period or available resources in the device.

EXAMPLE 23

This example includes the elements of example 22, wherein the resources comprise at least one of processing resources, memory resources or power resources in the device.

EXAMPLE 24

This example includes the elements of any of examples 19 to 23, wherein determining configuration criteria comprises analyzing the device to determine system condition information.

EXAMPLE 25

This example includes the elements of any of examples 19 to 24, wherein user expectation information comprises at least one of high compression/decompression speed or high compression/decompression ratio.

EXAMPLE 26

This example includes the elements of any of examples 18 to 25, wherein the at least one codec configuration comprises at least one of number of processing threads, data block size, dictionary size or compression level.

EXAMPLE 27

This example includes the elements of any of examples 18 to 26, and further comprises determining the at least one codec configuration by performing testing based on changes in device configuration.

EXAMPLE 28

This example includes the elements of any of examples 18 to 27, and further comprises determining if the configuration criteria have changed, and if the configuration criteria are determined to have changed, selecting a new codec configuration for configuring a codec module based on the changed configuration criteria and setting the new codec configuration in the codec module.

EXAMPLE 29

This example includes the elements of example 18, wherein the data characteristic information comprises at least one of data size or data type, the system condition information comprises at least one of resource usage in the device over a prior time period or available resources in the device, the resources comprising at least one of processing resources, memory resources or power resources in the device, and the user expectation information comprises at least one of high compression/decompression speed or high compression/decompression ratio.

EXAMPLE 30

This example comprises a system including at least a device, the system being arranged to perform any of the methods set forth above in examples 18 to 29.

EXAMPLE 31

This example comprises a chipset arranged to perform any of the methods set forth above in examples 18 to 29.

EXAMPLE 32

This example comprises at least one machine readable medium comprising a plurality of instructions that, in response to be being executed on a computing device, cause the computing device to carry out any of the methods set forth above in examples 18 to 29.

EXAMPLE 33

This example comprises at least one machine-readable storage medium having stored thereon, individually or in combination, instructions that when executed by one or more processors result in operations to perform any of the methods set forth above in examples 18 to 29.

EXAMPLE 34

This example comprises a device configured for dynamic compression/decompression (codec) configuration, the device being arranged to perform any of the methods set forth above in examples 18 to 29.

EXAMPLE 35

This example comprises a device having means to perform any of the methods set forth above in examples 18 to 29.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A device, comprising:
a codec module to perform data compression or data decompression;
a benchmark module to determine at least one codec configuration; and
a codec configuration module to:
   determine configuration criteria based at least in part on system condition information of said device, said system condition information comprising available resource information, wherein said available resource information comprises one or more of processing load, disk load, available power, number of available processor cores, amount of available memory, or a combination thereof;
   select a codec configuration determined by the benchmark module based on the configuration criteria; and
   set the selected codec configuration in the codec module.

2. The device of claim 1, wherein the benchmark module is to determine different codec configurations corresponding to different combinations of configuration criteria.

3. The device of claim 2, wherein the codec configuration module is to select one of the different codec configurations based on determining the combination of configuration criteria.

4. The device of claim 1, wherein the configuration criteria further comprises at least one of data characteristic information, user expectation information, or a combination thereof.

5. The device of claim 4, wherein the data characteristic information comprises at least one of data size or data type.

6. The device of claim 4, wherein user expectation information comprises at least one of high compression/decompression speed or high compression/decompression ratio.

7. The device of claim 1, wherein the at least one codec configuration comprises at least one of number of processing threads allocated to perform said data compression or data decompression, data block size, dictionary size or compression level.

8. The device of claim 1, wherein after setting the selected codec configuration the codec configuration module is further to:
determine if the configuration criteria has changed; and
if the configuration criteria are determined to have changed:
   select a new codec configuration determined by the benchmark module based on the changed configuration criteria; and
   set the new codec configuration in the codec module.

9. A method, comprising:
determining configuration criteria in a device based at least in part on system condition information, said system condition information comprising available resource information of said device, wherein said available resource information comprises one or more of processing load, disk load, available power, number of available processor cores, amount of available memory, or a combination thereof;
selecting a codec configuration for configuring a codec module in the device from at least one codec configuration determined by a benchmark module in the device, the selecting of the codec configuration being based on the configuration criteria; and setting the selected codec configuration in the codec module.

10. The method of claim 9, wherein the configuration criteria further comprises at least one of data characteristic information, user expectation information, or a combination thereof.

11. The method of claim 10, wherein the data characteristic information comprises at least one of data size or data type.

12. The method of claim 10, wherein user expectation information comprises at least one of high compression/decompression speed or high compression/decompression ratio.

13. The method of claim 9, wherein the at least one codec configuration comprises at least one of number of processing threads allocated to perform data compression or data decompression, data block size, dictionary size or compression level.

14. The method of claim 9, further comprising:
determining if the configuration criteria have changed; and
if the configuration criteria are determined to have changed:
selecting a new codec configuration for configuring a codec module based on the changed configuration criteria; and
setting the new codec configuration in the codec module.

15. At least one non-transitory machine-readable storage medium having stored thereon, individually or in combination, instructions that when executed by one or more processors result in the following operations comprising:
determining configuration criteria in a device based at least in part on system condition information, said system condition comprising available resource information of said device, wherein said available resource information comprises one or more of processing load, disk load, available power, number of available processor cores, amount of available memory, or a combination thereof;
selecting a codec configuration for configuring a codec module in the device from at least one codec configuration determined by a benchmark module in the device, the selecting of the codec configuration being based on the configuration criteria; and
setting the selected codec configuration in the codec module.

16. The medium of claim 15, wherein the configuration criteria further comprises at least one of data characteristic information, user expectation information, or a combination thereof.

17. The medium of claim 16, wherein the data characteristic information comprises at least one of data size or data type.

18. The medium of claim 16, wherein user expectation information comprises at least one of high compression/decompression speed or high compression/decompression ratio.

19. The medium of claim 15, wherein the at least one codec configuration comprises at least one of number of processing threads allocated to perform data compression or data decompression, data block size, dictionary size or compression level.

20. The medium of claim 15, further comprising instructions that when executed by one or more processors result in the following operations, comprising:
determining if the configuration criteria have changed; and
if the configuration criteria are determined to have changed:
selecting a new codec configuration for configuring a codec module based on the changed configuration criteria; and
setting the new codec configuration in the codec module.

* * * * *